(12) United States Patent
Ji et al.

(10) Patent No.: US 11,869,442 B2
(45) Date of Patent: Jan. 9, 2024

(54) DISPLAY PANEL AND DISPLAY DEVICE HAVING EMISSION CONTROL DRIVER

(71) Applicant: LG Display Co., Ltd., Seoul (KR)

(72) Inventors: Hyelim Ji, Paju-si (KR); Yeonkyung Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/899,259

(22) Filed: Aug. 30, 2022

(65) Prior Publication Data

US 2023/0075449 A1    Mar. 9, 2023

(30) Foreign Application Priority Data

Sep. 3, 2021  (KR) .......................... 10-2021-0117597
Dec. 31, 2021  (KR) .......................... 10-2021-0194722

(51) Int. Cl.
*G09G 3/3266* (2016.01)

(52) U.S. Cl.
CPC ... *G09G 3/3266* (2013.01); *G09G 2300/0842* (2013.01); *G09G 2310/0291* (2013.01)

(58) Field of Classification Search
CPC .. G09G 3/3266; G09G 3/3674; G09G 3/3677; G09G 3/3681; G09G 2310/061; G09G 2310/0286; G09G 2310/0267; G11C 19/28

See application file for complete search history.

(56) References Cited

U.S. PATENT DOCUMENTS

| | | | | |
|---|---|---|---|---|
| 2015/0356913 A1* | 12/2015 | Kim | ..................... | G09G 3/3266 345/215 |
| 2017/0344179 A1* | 11/2017 | Kim | ..................... | G09G 3/3677 |
| 2018/0005573 A1* | 1/2018 | Kim | ..................... | G09G 3/3266 |
| 2019/0035322 A1* | 1/2019 | Kim | ..................... | G09G 3/3233 |
| 2021/0065632 A1* | 3/2021 | Kim | ..................... | G09G 3/3266 |

FOREIGN PATENT DOCUMENTS

| KR | 10-2019-0021985 A | 3/2019 |
|---|---|---|
| KR | 10-2021-0045034 A | 4/2021 |

* cited by examiner

*Primary Examiner* — Nitin Patel
*Assistant Examiner* — Amen W Bogale
(74) *Attorney, Agent, or Firm* — Birch, Stewart, Kolasch & Birch, LLP

(57) ABSTRACT

A display panel and a display device having an emission control driver are discussed. The display device can include a display panel to display an image through sub pixels, a scan driver to supply a second scan signal to each of second gate lines, and an emission control driver to supply an emission control signal to each of third gate lines and supply a first scan signal to each of first gate lines. Each emission control stage of the emission control driver can include an output buffer. The output buffer can output an emission control signal to an output line and output a first scan signal to a scan output line under control of a first control node, and output a high potential power supply voltage to the output line and output a low potential power supply voltage to the scan output line under control of a second control node.

20 Claims, 9 Drawing Sheets

DISPLAY PANEL AND DISPLAY DEVICE HAVING EMISSION CONTROL DRIVER

CROSS-REFERENCE TO RELATED APPLICATIONS

This application claims the priority benefit of the Korean Patent Application No. 10-2021-0117597 filed on Sep. 3, 2021 in the Republic of Korea and No. 10-2021-0194722 filed on Dec. 31, 2021 in the Republic of Korea, the entire contents of all these applications being hereby expressly incorporated by reference into the present application.

BACKGROUND

Technical Field

The present disclosure relates to an emission control driver, a display panel, and a display device capable of reducing a bezel area.

Description of the Related Art

A light emitting display device uses a self-emission device configured to emit light through the use of organic light emitting layer by a recombination of electrons and holes so that it is possible to realize advantages of high luminance, low driving voltage, ultra-thin profile, and freedom in shape.

The light emitting display device includes a panel for displaying an image through a pixel matrix, and a driving circuit for driving the panel. Each of pixels constituting the pixel matrix is independently driven by a thin film transistor TFT.

A gate driver for controlling the thin film transistor TFT of the pixels can be disposed in a bezel area of the display panel. The gate driver can include a plurality of scan drivers for controlling a switching TFT in each pixel, and a light emitting control driver for controlling a light emitting control TFT, whereby the bezel area can be increased.

The disclosure of the above-described background art is owned by the inventor of the present disclosure to devise the present disclosure or is technical information acquired by a process of devising the present disclosure, but may not be regarded as the known art disclosed to the general public before the present disclosure is disclosed.

SUMMARY OF THE DISCLOSURE

The present disclosure has been made in view of the above problems and other limitations associated with the related art, and one or more aspects of the present disclosure provides an emission control driver, a display panel, and a display device capable of reducing a bezel area.

In addition to the technical benefits of the present disclosure as mentioned above, additional technical benefits and features of the present disclosure will be clearly understood by those skilled in the art from the following description of the present disclosure.

In accordance with an aspect of the present disclosure, a display device can include a display panel configured to display an image through sub pixels, a scan driver embedded in the display panel and configured to supply a second scan signal to each of second gate lines connected to the sub pixels, and an emission control driver embedded in the display panel and configured to supply an emission control signal to each of third gate lines connected to the sub pixels and supply a first scan signal to each of first gate lines connected to the sub pixels, the emission control driver comprising a plurality of emission control stages. Each of the plurality of emission control stages can include an output buffer configured to output the emission control signal to an output line and output a first scan signal to a scan output line by using a clock signal under control of a first control node (a Q node), and configured to output a high potential power supply voltage to the output line and output a low potential power supply voltage to the scan output line under control of a second control node (a QB node), a charge/discharge part configured to charge the Q node by using the second scan signal supplied from the scan driver, and discharge the Q node by controlling the QB node, and an inverter configured to charge and discharge the QB node to be opposite to the Q node.

In accordance with another aspect of the present disclosure, a display panel can include a display area configured to display an image through sub pixels, a bezel area surrounding the display area, a scan driver disposed in the bezel area and configured to supply a second scan signal to each of second gate lines connected to the sub pixels, and an emission control driver disposed in the bezel area, configured to supply an emission control signal to each of third gate lines connected to the sub pixels, and configured to supply a first scan signal to each of first gate lines connected to the sub pixels, the emission control driver comprising a plurality of emission control stages. Each of the plurality of emission control stages can include an output buffer configured to output the emission control signal to an output line and output a first scan signal to a scan output line by using a clock signal under control of a first control node (a Q node), and configured to output a high potential power supply voltage to the output line and output a low potential power supply voltage to the scan output line under control of a second control node (a QB node), a charge/discharge part configured to charge the Q node by using the second scan signal supplied from the scan driver, and discharge the Q node by controlling the QB node, and an inverter configured to charge and discharge the QB node to be opposite to the Q node.

In addition to the features of the present disclosure as mentioned above, additional technical benefits and features of the present disclosure will be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION OF THE EMBODIMENTS

Figure 1:
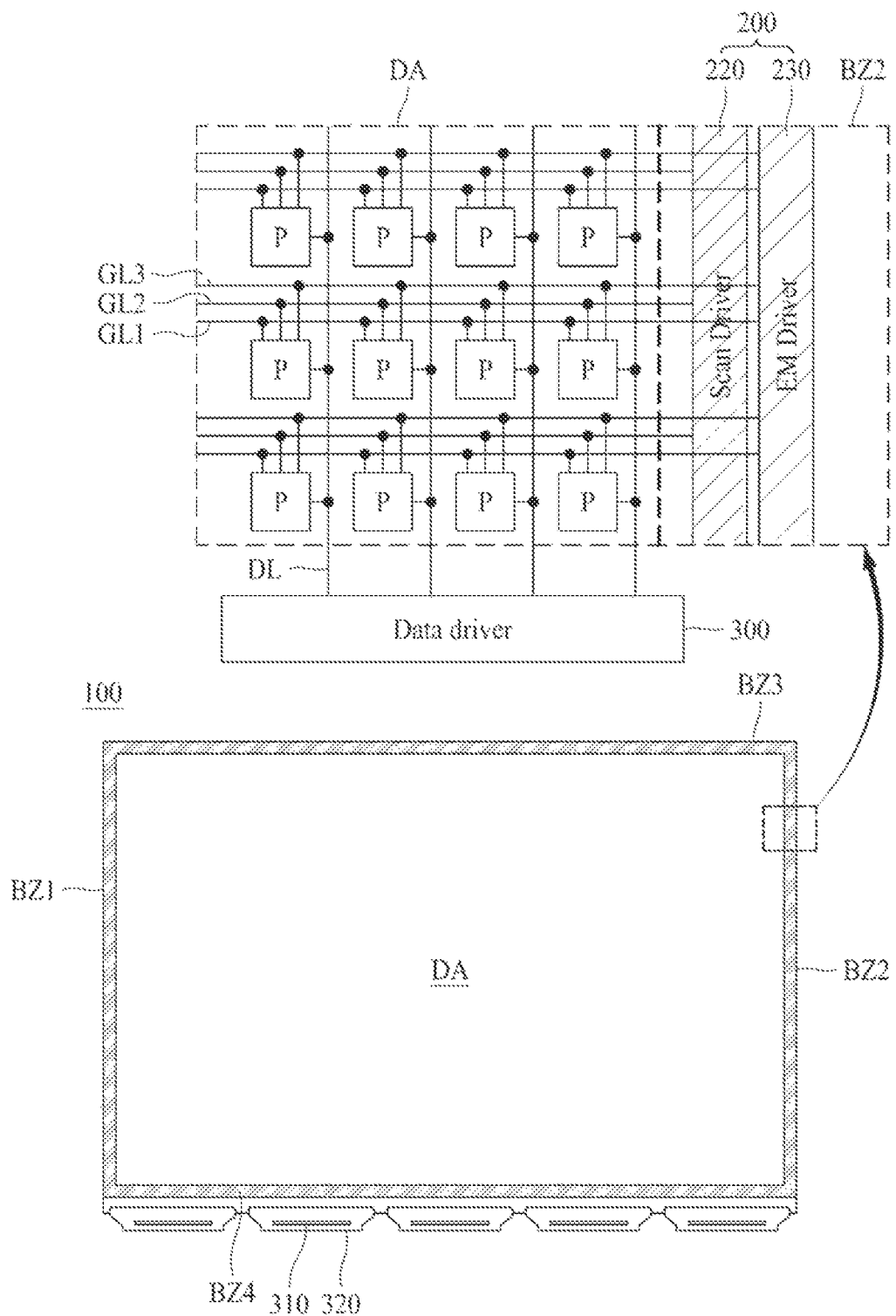
FIG. 1 is a block diagram schematically illustrating a configuration of a display device according to one embodiment of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part can be added unless 'only~' is used. The terms of a singular form can include plural forms unless referred to the contrary.

In construing an element, the element is construed as including an error range although there is no explicit description.

In describing a position relationship, for example, when a position relation between two parts is described as "on," "over," "under," and "next," one or more other parts can be disposed between the two parts unless a more limiting term, such as "just" or "direct(ly)" is used.

In describing a time relationship, for example, when the temporal order is described as, for example, "after," "subsequent," "next," and "before," a case which is not continuous can be included unless a more limiting term, such as "just," "immediate(ly)," or "direct(ly)" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., can be used. These terms are intended to identify the corresponding elements from the other elements, and basis, order, or number of the corresponding elements should not be limited by these terms. The expression that an element or a layer is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various aspects of the present disclosure can be partially or overall coupled to or combined with each other, and can be variously inter-operated with each other and driven technically as those skilled in the art can sufficiently understand. The aspects of the present disclosure can be carried out independently from each other, or can be carried out together in co-dependent relationship.

Hereinafter, the aspect of the present disclosure will be described with reference to the accompanying drawings. Since a scale of each of elements shown in the accompanying drawings is different from an actual scale for convenience of description, the present disclosure is not limited to the shown scale. Further, all the components of each display device according to all embodiments of the present disclosure are operatively coupled and configured.

FIG. 1 is a block diagram schematically illustrating a configuration of a display device according to one embodiment of the present disclosure.

The display device according to one embodiment of the present disclosure can be an electroluminescent display device including an organic light emitting diode OLED display device, a quantum dot light emitting diode display device, or an inorganic light emitting diode display device.

Referring to FIG. 1, the display device can include a display panel 100, a gate driver 200 embedded in the display panel 100, and a data driver 300.

The display panel 100 displays an image through a display area DA in which a plurality of sub pixels P are arranged in a matrix configuration. The sub pixel P can be any one of red R sub pixel emitting red light, green G sub pixel emitting green light, blue B sub pixel emitting blue light, and white W sub pixel emitting white light. A unit pixel can include at least two sub pixels having different emission colors. Each sub pixel P can include an emission device, and a plurality of TFTs for independently driving the emission device. In the display panel 100, there are a plurality of signal lines including a data line DL, a gate line GL1, GL2, GL3, a power line, and other signal lines, which are connected to each sub pixel P.

The display panel 100 can further include a touch sensor screen disposed in the display area DA and configured to sense a user's touch.

The gate driver 200 can surround the display area DA in the display panel 100 and can be disposed in at least any one bezel area of bezel areas BZ1~BZ2 located in the periphery of the display panel 100. For example, the gate driver 200 can be disposed in any one of the first and second bezel areas BZ1 and BZ2 facing each other with the display area DA interposed in-between, or can be disposed in both of the first and second bezel areas BZ1 and BZ2. The gate driver 200 can be a gate-in-panel GIP type composed of the thin film transistors TFTs formed in the same process as a TFT array disposed in the display area DA.

The gate driver 200 can include a scan driver 220 for driving the second gate line GL2 among the first to third gate lines GL1, GL2, and GL3 connected to sub pixels P of each horizontal line, and an emission control driver 230 for driving the first gate line GL1 and the third gate line GL3.

Each of the scan driver 220 and the emission control driver 230 can be operated by receiving a gate control signal supplied from a timing controller through a level shifter.

The scan driver 220 can include a plurality of second scan stages for supplying a second scan signal to the plurality of second gate lines GL2, respectively. The second scan signal can control a second switching TFT of each of the plurality of sub pixels P connected to the second gate line GL2.

The emission control driver 230 can include a plurality of emission control stages for individually supplying a first scan signal to the plurality of first gate lines GL1 and individually supplying an emission control signal to the plurality of third gate lines GL3. The first scan signal can control a first switching TFT of each of the plurality of sub pixels P connected to the first gate line GL1. The emission control signal can control an emission control TFT of each of the plurality of sub pixels P connected to the third gate line GL3. A detailed description for this structure will be given later.

The emission control driver 230 can reduce the circuit configuration and size of the gate driver by outputting the emission control signal and the first scan signal by the use of the second scan signal output from the scan driver 220. Accordingly, it is possible to reduce the bezel area BZ1 and BZ2 of the display panel.

The data driver 300 can convert digital data received from the timing controller into an analog data signal and can supply each data voltage signal to each data line DL of the display panel 100. The data driver 300 can convert the digital data into the analog data voltage signal using grayscale voltages obtained by subdividing a plurality of reference gamma voltages supplied from a gamma voltage generator.

The data driver 300 can include a plurality of data drive integrated circuits ICs 310 that divide and drive the plurality of data lines DL disposed in the display panel 100. Each of the plurality of data drive ICs 310 can be individually mounted on each circuit film 320 such as a Chip On Film COF type. The plurality of COFs 320 on which the data drive IC 310 is mounted can be bonded to the bezel area BZ4 of the display panel 100 through the use of anisotropic conductive film ACF.

At least one of an amorphous silicon TFT using an amorphous silicon semiconductor layer, a polysilicon TFT using a polysilicon semiconductor layer, and an oxide TFT using a metal oxide semiconductor layer can be applied to the plurality of TFTs disposed in the display area DA of the display panel 100 and the bezel areas BZ1 to BZ2 including the gate driver 200.

For example, an oxide TFT, which has a higher mobility than that of an amorphous silicon TFT and facilitates a low temperature process in comparison to a polysilicon TFT, and also is capable of being applied to a large size, can be applied to the display panel 100, and an oxide TFT of coplanar type having good TFT characteristics can be applied to the display panel 100. The oxide TFT can further include a light shielding layer disposed below the oxide semiconductor layer with a buffer layer interposed therebetween to prevent light from flowing into the oxide semiconductor layer.

Figure 2:
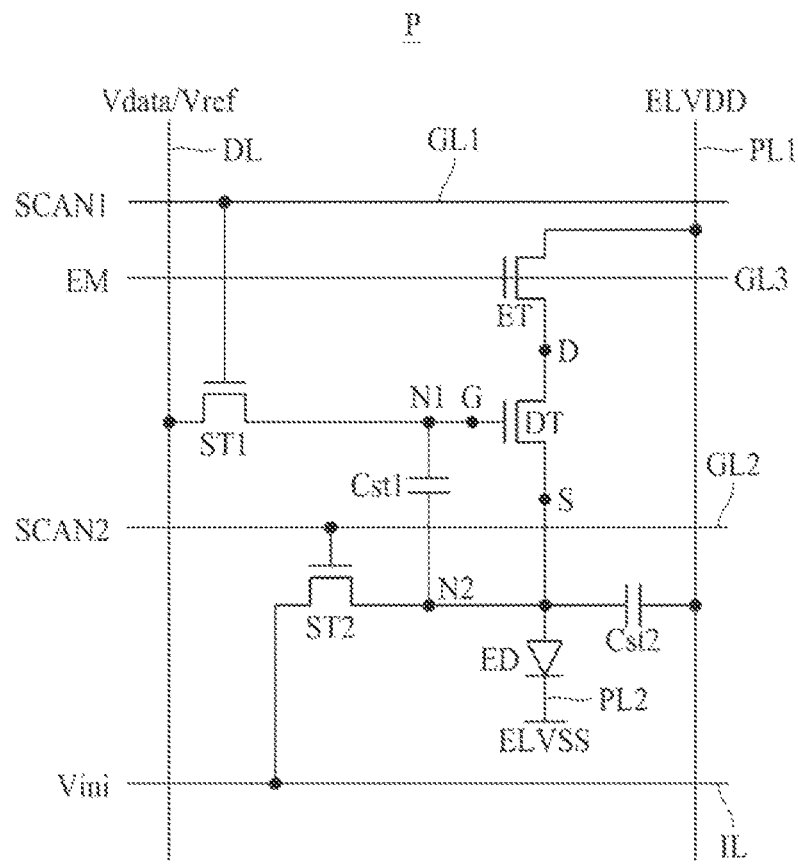
FIG. 2 is an equivalent circuit diagram illustrating a pixel circuit according to one embodiment of the present disclosure.
Figure 3:
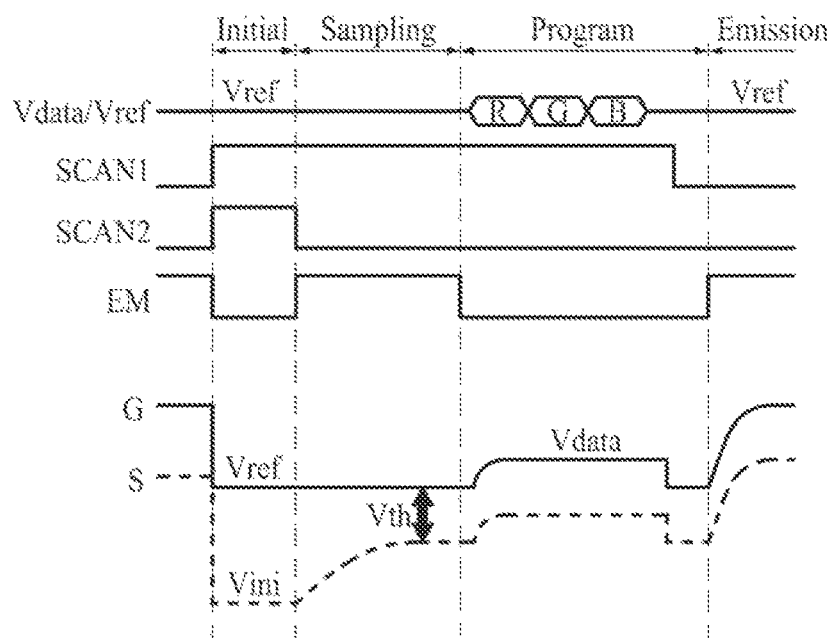
FIG. 3 is a driving waveform diagram of the pixel circuit shown in FIG. 2.

FIG. 2 is an equivalent circuit diagram illustrating a pixel circuit according to one embodiment of the present disclosure, and FIG. 3 is a driving waveform diagram of the pixel circuit shown in FIG. 2.

Referring to FIG. 2, the pixel circuit of each sub pixel P can be provided in a 4T2C structure including a driving TFT DT for supplying a current to a light emitting device ED, a switching TFT ST1, an initialization TFT ST2, an emission control TFT ET, and a storage capacitor Cst1 and Cst2.

Each sub pixel P can be connected to the first to third gate lines GL1, GL2, GL3, the data line DL, first and second power lines PL1 and PL2, and an initialization voltage line IL disposed on the display panel 100.

The scan driver 220 can supply the second scan signal SCAN2 to the second gate line GL2. The emission control driver 230 can supply the first scan signal SCAN1 to the first gate line GL1, and can supply the emission control signal EM to the third gate line GL3. The data driver 300 can supply a data voltage Vdata to the data line DL. A power circuit can supply a high potential power supply voltage ELVDD to the first power line PL1, a low potential power supply voltage ELVSS to the second power line PL2, and an initialization voltage Vini to the initialization voltage line IL.

Referring to FIG. 3, each sub pixel P can be driven to include an initial period, a sampling period, a program period, and an emission period for each frame.

Referring to FIGS. 2 and 3, the switching TFT ST1 can be controlled by the first gate line GL1, and can connect the data line DL to a first node N1 connected to a gate electrode G of the driving TFT DT. During the initialization period, the sampling period, and the program period, the switching TFT ST1 is turned-on by the high potential power supply voltage of the first scan signal SCAN1 of the first gate line GL1 to sequentially supply a reference voltage Vref and the data voltage Vdata supplied through the data line DL1 to the first node N1.

The initialization TFT ST2 can be controlled by the second gate line GL2 and can connect the initialization voltage line IL to a second node N2 commonly connected with a source electrode S of the driving TFT DT and an anode of the light emitting device ED. During the initialization period, the initialization TFT ST2 is turned-on by the high potential power supply voltage of the second scan signal SCAN2 of the second gate line GL2 to supply the initialization voltage Vini of the initialization voltage line IL to the second node N2.

The emission control TFT ET can be controlled by the third gate line GL3, and can connect the first power line PL1 to a drain electrode D of the driving TFT DT. During the sampling period and the emission period, the emission control TFT ET can be turned-on by the high potential power supply voltage of the emission control signal EM of the third gate line GL3, and can supply the high potential power supply voltage ELVDD of the first power line PL1 to the drain electrode D of the driving TFT DT.

The first storage capacitor Cst1 can be connected between the first node N1 and the second node N2 to charge the data voltage Vdata+Vth whose threshold voltage Vth of the driving TFT DT is compensated.

The second storage capacitor Cst2 is connected between the first power line PL1 and the second node N2 commonly connected with the source electrode S of the driving TFT DT and the anode of the light emitting device ED, to thereby stably maintain the potential of the second node N2 during the emission period.

The driving TFT DT can control an emission intensity of the light emitting device LED by controlling a current Ids flowing to the light emitting device ED according to the driving voltage Vdata+Vth charged in the first storage capacitor Cst1.

The light emitting device ED can include an anode connected to the source electrode S of the driving TFT DT, a cathode connected to the second power line PL2 for supplying the low potential power supply voltage ELVSS, and an organic light emitting layer between the anode and the cathode. The light emitting device ED can generate light of brightness proportional to a current value of a driving current supplied from the driving TFT DT.

Referring to FIG. 3, during the initialization period, the first node N1 is initialized to the reference voltage Vref through the data line DL and the switching TFT ST1, and the second node N2 is initialized to the initialization voltage Vini through the initialization voltage line IL and the initialization TFT ST2. Also, the high potential power supply voltage ELVDD can be supplied to the drain electrode D of the driving TFT DT through the first power line PL1 and the emission control TFT ET.

During the sampling period, the voltage of the source electrode S of the driving TFT DT can be increased until a gate-source voltage Vgs of the driving TFT DT becomes the threshold voltage Vth by a source follow operation of the driving TFT DT, whereby the first storage capacitor Cst1 can charge the threshold voltage Vth of the driving TFT DT.

During the program period, the data voltage Vdata is supplied to the first node N1 so that the first storage capacitor Cst1 can charge the data voltage Vdata+Vth whose threshold voltage Vth of the driving TFT DT is compensated. Accordingly, it is possible to compensate the characteristic deviation by the threshold voltage of the driving TFT DT between the sub pixels P for the emission period.

During the emission period, the driving TFT DT can drive the light emitting device ED according to the driving voltage Vdata+Vth charged in the first storage capacitor Cst1, to thereby control the emission intensity.

Figure 4:
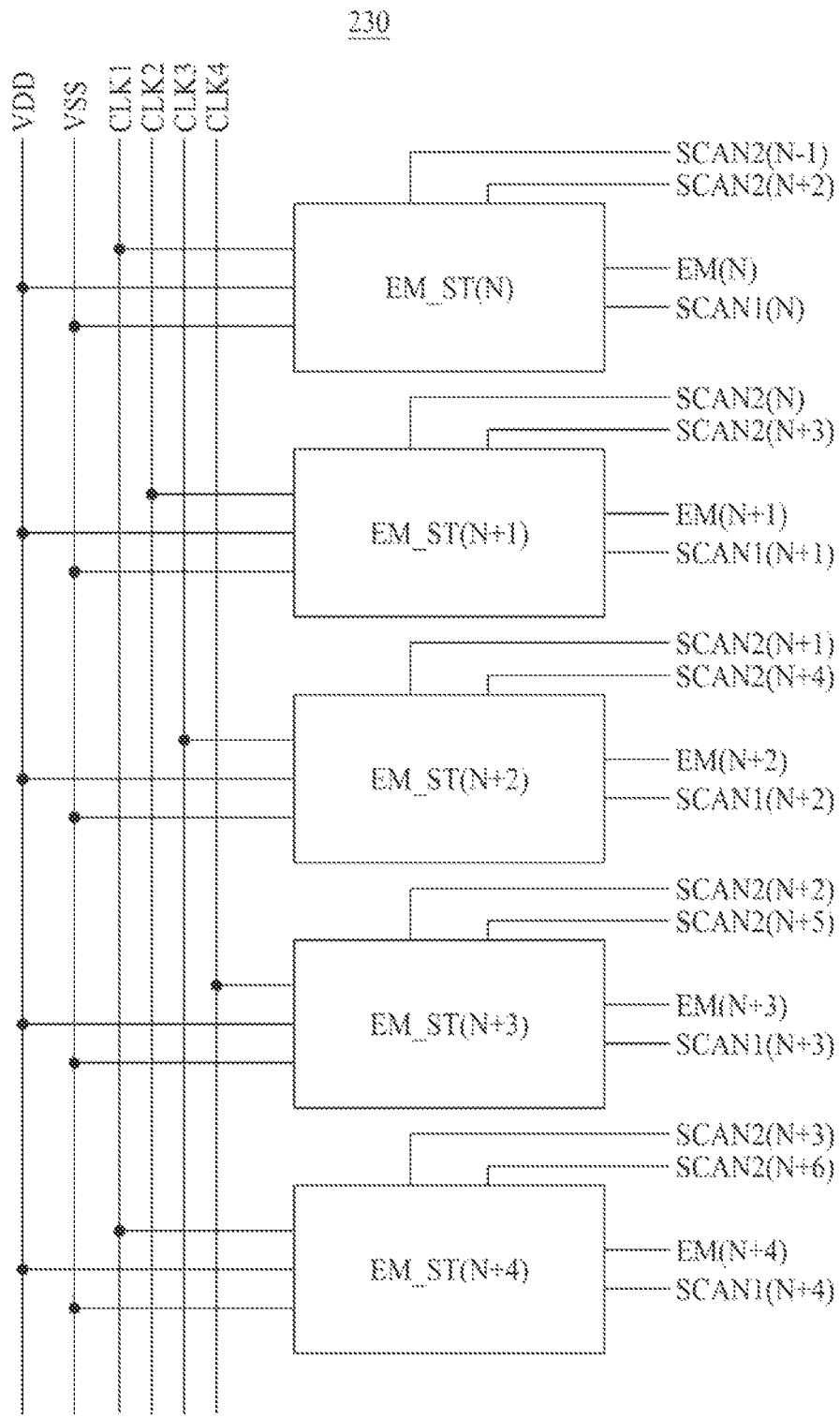
FIG. 4 is a block diagram illustrating a configuration of some stages of an emission control driver according to one embodiment of the present disclosure.

FIG. 4 is a block diagram of the emission control driver 230 according to one embodiment of the present disclosure.

Referring to FIG. 4, the emission control driver 230 according to one embodiment of the present disclosure can include a plurality of emission control stages EM_ST(N)~EM_ST(N+4) for sequentially outputting the plurality of emission control signals EM(N)~EM(N+4) (herein, 'N' is an integer greater than 2). In FIG. 4, only five emission control stages EM_ST(N)~EM_ST(N+4) are shown for convenience of explanation.

The plurality of emission control stages EM_ST(N)~EM_ST(N+4) can be supplied with any one of a plurality of clock signals CLK1 to CLK4 having different phases. The plurality of emission control stages EM_ST(N)~EM_ST(N+4) can be supplied with the high potential power supply voltage VDD and the low potential power supply voltage VSS in common.

Each of the plurality of emission control stages EM_ST(N)~EM_ST(N+4) can be supplied with the plurality of second scan signals output from the scan driver 220 as first and second input signals.

For example, the (N)th emission control stage EM_ST(N) can be supplied with the second (N−1) scan signal SCAN2(N−1) supplied to the second gate line GL2 of the (N−1)th horizontal line from the (N−1)th scan stage of the scan driver 220, and the second (N+2) scan signal SCAN2(N+2) supplied to the second gate line GL2 of the (N+2)th horizontal line from the (N+2)th scan stage as the first and second input signals, and can charge and discharge the Q node and the QB node.

The (N+1)th emission control stage EM_ST(N+1) can be supplied with the second (N) scan signal SCAN2(N) from the (N)th scan stage of the scan driver 220 and the second (N+3) scan signal SCAN2(N+3) from the (N+3)th scan stage as the first and second input signals, and can charge and discharge the Q node and the QB node.

The (N+2)th emission control stage EM_ST(N+2) can be supplied with the second (N+1) scan signal SCAN2(N+1) from the (N+1)th scan stage of the scan driver 220 and the second (N+4) scan signal SCAN2(N+4) from the (N+4)th scan stage as the first and second input signals, and can charge and discharge the Q node and the QB node.

The (N+3)th emission control stage EM_ST(N+3) can be supplied with the second (N+2) scan signal SCAN2(N+2) from the (N+2)th scan stage of the scan driver 220 and the second (N+5) scan signal SCAN2(N+5) from the (N+5)th scan stage as the first and second input signals, and can charge and discharge the Q node and the QB node.

The (N+4)th emission control stage EM_ST(N+4) can be supplied with the second (N+3) scan signal SCAN2(N+3) from the (N+3)th scan stage of the scan driver 220 and the second (N+6) scan signal SCAN2(N+6) from the (N+6)th scan stage as the first and second input signals, and can charge and discharge the Q node and the QB node.

Figure 5:
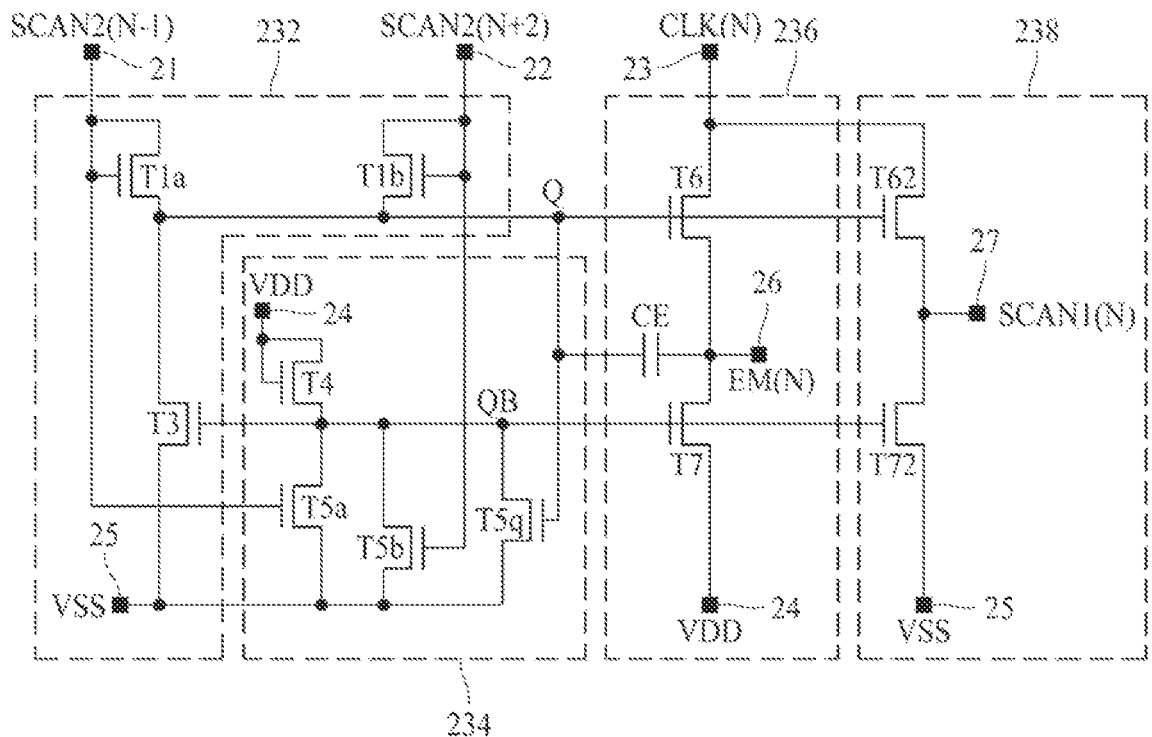
FIG. 5 is an equivalent circuit diagram illustrating a circuit configuration of an emission control stage in the emission control driver according to one embodiment of the present disclosure.
Figure 6:
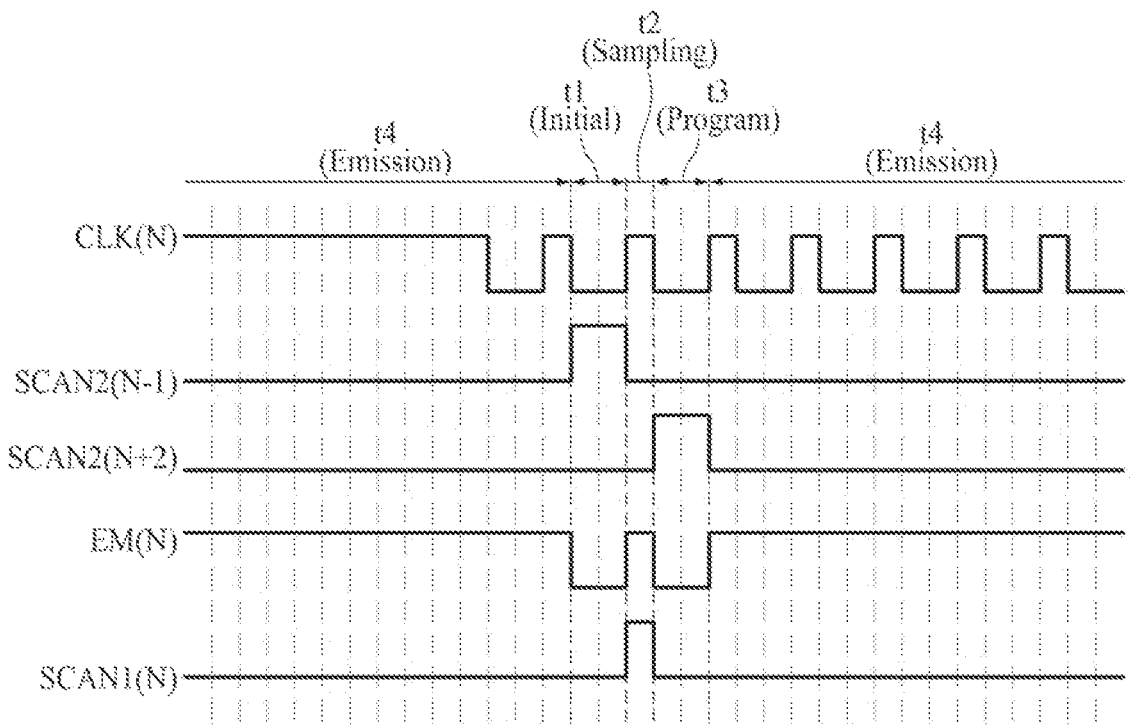
FIG. 6 is a driving waveform diagram of the emission control stage shown in FIG. 5.

FIG. 5 is an equivalent circuit diagram illustrating a configuration of each emission control stage in the emission control driver according to one embodiment of the present disclosure, and FIG. 6 is a driving waveform diagram of the emission control stage shown in FIG. 5.

Referring to FIG. 5, each emission control stage EM_ST(N) can be connected to a first input line 21 to which the second (N−1) scan signal SCAN2(N−1) is supplied from the (N−1)th scan stage of the scan driver 220, a second input line 22 to which the second (N+2) scan signal SCAN2(N+2) is supplied from the (N+2)th scan stage of the scan driver 220, a clock line 23 to which the clock signal CLK(N) is supplied, a first power line 24 to which the high potential power supply voltage VDD is supplied, a second power line 25 to which the low potential power supply voltage VSS is supplied, an output line 26 configured to output the emission control signal EM(N), and a scan output line 27 configured to output the first scan signal SCAN1(N).

The high potential power supply voltage VDD can be defined as a gate high voltage or a gate-on voltage. The low potential power supply voltage VSS can be defined as a gate low voltage or a gate-off voltage.

The clock signal CLK(N) can be any one of the plurality of clock signals having different phases. Each clock signal CLK(N) can be supplied in type of a pulse in which a gate-on (high) level of a specific horizontal period and a gate-off (low) level of a specific horizontal period are alternated. The gate-on level of each clock signal CLK(N) can be equal to the high potential power supply voltage VDD, and the gate-off level can be equal to the low potential power supply voltage VSS.

In FIG. 6, first to fourth periods t1, t2, t3, and t4 can correspond to the initialization period, the sampling period, the program period, and the emission period of the pixel circuit to which the first scan signal SCAN1(N) and the emission control signal EM(N) are supplied.

Each emission control stage EM_ST(N) can output the emission control signal EM(N) of the pulse type having the gate-off voltage in the first period t1 corresponding to the initialization period and the third period t3 corresponding to the program period, and having the gate-on voltage in the second period t2 corresponding to the sampling period and the fourth period t4 corresponding to the emission period.

Each emission control stage EM_ST(N) can output the first scan signal SCAN1(N) of the pulse type having the gate-on voltage during the second period t2 and having the gate-off voltage during the first, third, and fourth periods t1, t3, and t4.

Each emission control stage EM_ST(N) can include a charge/discharge part 232, an inverter 234, and an output buffer 236. The charge/discharge part 232 can be defined as a first node control part for controlling the Q node, which is a first control node of the output buffer 236, and the inverter 234 can be defined as a second node control part for controlling the QB node, which is a second control node of the output buffer 236. Both the charge/discharge part 232 and the inverter 234 can be defined as control parts for controlling the Q node and the QB node.

The charge/discharge part 232 can include a charge transistor T1a and T1b for charging the Q node, and a discharge transistor T3 for discharging the Q node. The inverter 234 can include a charge transistor T4 for charging the QB node, and a discharge transistor T5a, T5b, and T5q for discharging the QB node. The output buffer 236 can include an output transistor T6 and T7 for charging and discharging the output line 26 outputting the emission control signal EM(N), an output transistor T62 and T72 for charging and discharging the scan output line 27 outputting the first scan signal SCAN1(N), and a capacitor CE.

The charge/discharge part 232 can charge the Q node in response to the second (N−1) scan signal SCAN2(N−1) of the scan driver 220 supplied to the first input line 21, and also can charge the Q node in response to the second (N+2) scan signal SCAN2(N+2) of the scan driver 220 supplied to the second input line 22. The charge/discharge part 232 can discharge the Q node to the low potential power supply voltage VSS in response to the control of the QB node.

The charge/discharge part 232 can include a first charge transistor T1a having a gate electrode and a drain electrode connected to the first input line 21 in a diode structure and a source electrode connected to the Q node. The first charge transistor T1a can charge the Q node with the second (N−1) scan signal SCAN2(N−1), for example, charge the Q node to the on-level of the second (N−1) scan signal SCAN2(N−1) during the first period t1 when the second (N−1) scan signal SCAN2(N−1) is activated to the on-level. The first charge transistor T1a can be defined as a first charge diode.

The charge/discharge part 232 can include a second charge transistor T1b having a gate electrode and a drain electrode connected to the second input line 22 in a diode structure and a source electrode connected to the Q node. The second charge transistor T1b can charge the Q node with the second (N+2) scan signal SCAN2(N+2, for example, charge the Q node to the on-level of the second (N+2) scan signal SCAN2(N+2) during the third period t3 when the second (N+2) scan signal SCAN2(N+2) is activated to the on-level. The second charge transistor T1b can be defined as a second charge diode.

The charge/discharge part 232 can include a first discharge transistor T3 in which a gate electrode is connected to the QB node, a drain electrode is connected to the Q node, and a source electrode is connected to the second power line 25. The first discharge transistor T3 can discharge the Q node to the low potential power supply voltage VSS during the fourth period t4 when the QB node is activated to the on-level.

The inverter 234 can control the QB node to be opposite to the Q node. The inverter 234 can include a third charge transistor T4 connected in a diode structure between the first power line 24 and the QB node. The third charge transistor T4 is turned-on by the high potential power supply voltage VDD to charge the QB node with the high potential power supply voltage VDD. The third charge transistor T4 can be defined as a third charge diode.

The inverter 234 can include a second discharge transistor T5a controlled by the second (N−1) scan signal SCAN2(N−1) supplied to the first input line 21 to discharge the QB node to the low potential power supply voltage VSS. The second discharge transistor T5a can discharge the QB node to the low potential power supply voltage VSS during the first period t1 when the second (N−1) scan signal SCAN2(N−1) is activated to the on-level.

The inverter 234 can include a third discharge transistor T5b controlled by the second (N+2) scan signal SCAN2(N+2) supplied to the second input line 22 to discharge the QB node to the low potential power supply voltage VSS. The third discharge transistor T5b can discharge the QB node to the low potential power supply voltage VSS during the third period t3 when the second (N+2) scan signal SCAN2(N+2) is activated to the on-level.

The inverter 234 can include a fourth discharge transistor T5q controlled by the Q node to discharge the QB node to the low potential power supply voltage VSS. The fourth discharge transistor T5q can discharge the QB node to the low potential power supply voltage VSS during the periods t1, t2, and t3 when the Q node is activated to the on-level.

The output buffer 236 can include the first output transistor T6 for outputting the clock signal CLK(N), which is supplied to the clock line 23, to the output line 26 in response to the control of the Q node, and the second output transistor T62 for outputting the clock signal CLK(N) to the scan output line 27. The first output transistor T6 can output the clock signal CLK(N) as the off-level and on-level of the emission control signal EM(N) through the output line 26 during the periods t1, t2, and t3 when the Q node is activated to the on-level. The second output transistor T62 can output the clock signal CLK(N) as the off-level and on-level of the first scan signal SCAN1(N) through the scan output line 27 during the periods t1, t2, and t3 when the Q node is activated to the on-level.

The output buffer 236 can include the third output transistor T7 for outputting the high potential power supply voltage VDD, which is supplied to the first power line 24, to the output line 26 in response to the control of the QB node, and the fourth output transistor T72 for outputting the low potential power supply voltage VSS, which is supplied to the second power line 25, to the scan output line 27. The third output transistor T7 can stably supply the high potential power supply voltage VDD to enable the on-level of the emission control signal EM through the output line 26 during most of the fourth period t4 when the QB node is activated to the on-level. The fourth output transistor T72 can stably supply the low potential power supply voltage VSS to enable the off-level of the first scan signal SCAN1 (N) through the scan output line 27 during most of the fourth period t4 when the QB node is activated to the on-level.

Figure 7:
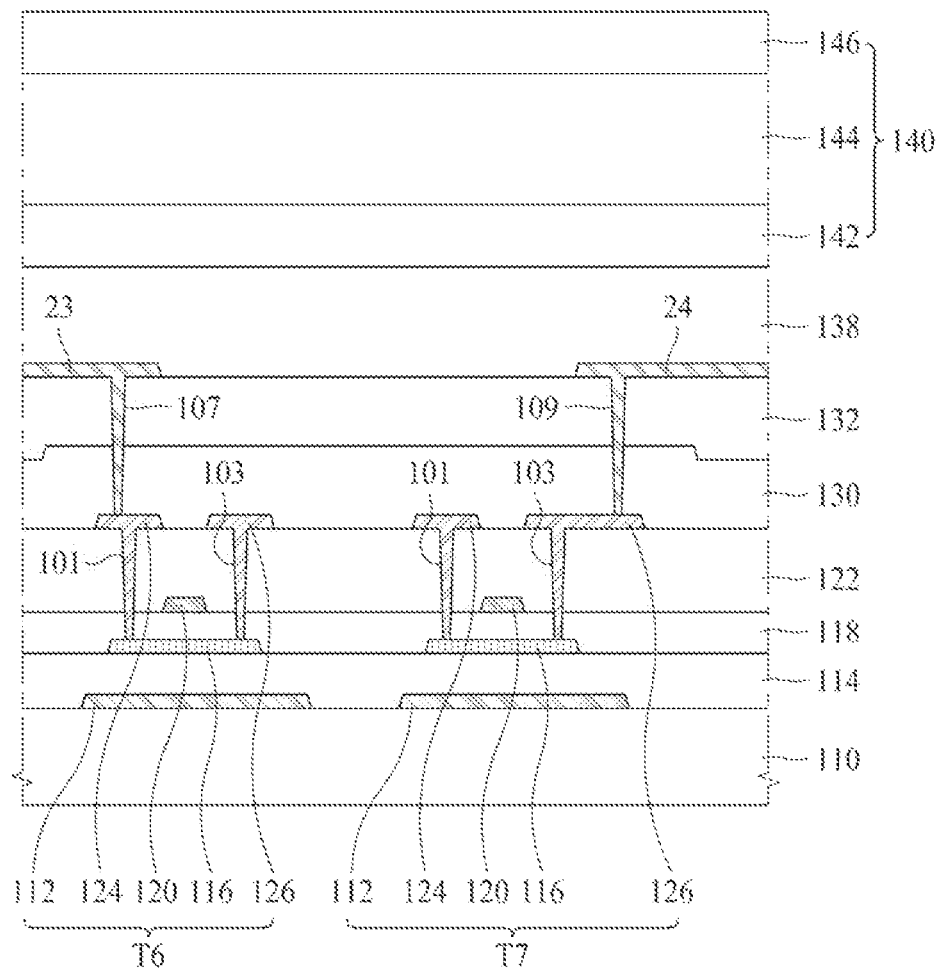
FIG. 7 is a cross sectional view illustrating a structure of some TFTs of the emission control driver according to one embodiment of the present disclosure.

The transistors T1a, T1b, T3, T4, T5a, T5b, T5q, T6, T7, T62, and T72 constituting each emission control stage EM_ST(N) can be a coplanar oxide TFT including a light shielding layer 112 as shown in FIG. 7.

FIG. 7 illustrates a simplified cross-sectional structure of some TFTs of the emission control driver, for example, the output transistors T6 and T7 according to one embodiment of the present disclosure.

The output transistors T6 and T7 can include a light shielding layer 112 disposed on a substrate 110, a buffer film 114 covering the light shielding layer 112, a semiconductor layer 116 disposed on the buffer film 114, a gate insulating film 118 covering the semiconductor layer 116, a gate electrode 120 disposed on the gate insulating film 118, an insulating interlayer 122 covering the gate electrode 120, and a source electrode 126 and a drain electrode 124 disposed on the insulating interlayer 112 and connected to conductive regions of the semiconductor layer 116 through contact holes 103 and 101, respectively. The remaining transistors T1a, T1b, T3, T4, T5a, T5b, T5q, T62, and T72 of the emission control driver 230 can have a similar structure to those of the output transistors T6 and T7.

The emission control driver 230 can further include an inorganic insulating film 130 and an organic insulating film 132 covering the source electrode 126 and the drain electrode 124, a clock line 23 and a power line 24 disposed on the organic insulating film 132, an organic insulating film 138 covering the clock line 23 and the power line 24, an encapsulation layer 140 stacked on the organic insulating film 138, and having an inorganic insulating film 142, an organic insulating film 144 and an inorganic insulating film 146. The clock line 23 is connected to the drain electrode 124 of the output transistor T6 through the contact hole 107, and the power line 24 can be connected to the source electrode 126 of the output transistor T7 through the contact hole 109. Another power line 25 can be disposed in the same layer as the clock line 23 and the power line 24.

The semiconductor layer 116 can include a channel region overlapping the gate electrode 120 with the gate insulating film 118 interposed therebetween, and a conductor region disposed on both sides of the channel region and be in ohmic-contact with the source electrode 126 and the drain electrode 124, respectively. The semiconductor layer 116 can include an oxide semiconductor material. For example, the semiconductor layer 116 can include at least one of IZO(InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based, and ITZO(InSnZnO)-based materials.

The light shielding layer 112 can be made of an opaque metal and can absorb external light or internal light, thereby preventing light from flowing into the oxide semiconductor layer 116.

The light shielding layer 112 of the transistors T1a, T1b, T3, T4, T5a, T5b, T5q, T6, T7, T62 and T72 constituting each emission control stage EM_ST(N) can be floated or can be connected to the gate electrode 120 or the source electrode 126.

FIGS. 8A to 11B illustrate the operation and driving waveforms of the first to fourth periods t1, t2, t3, and t4 of the emission control stage EM_ST(N) shown in FIG. 5.

Figure 8A:
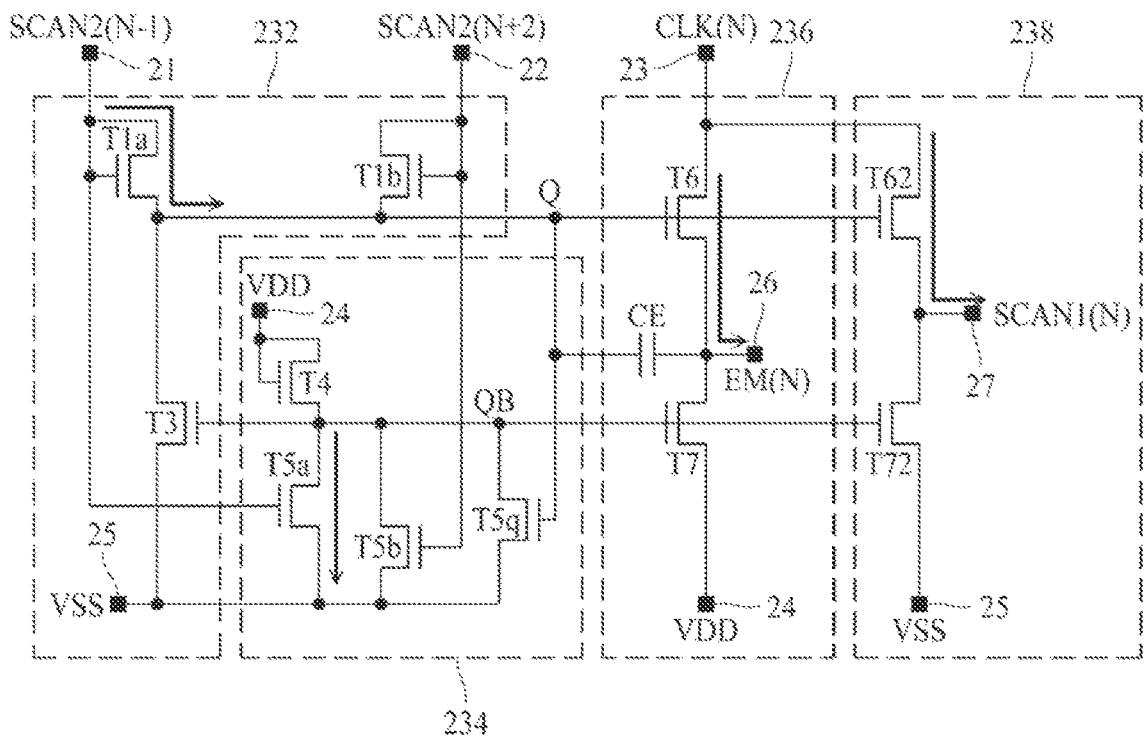
FIGS. 8A and 8B illustrate an operation and a driving waveform during a first period of the emission control stage according to one embodiment of the present disclosure.
Figure 8B:
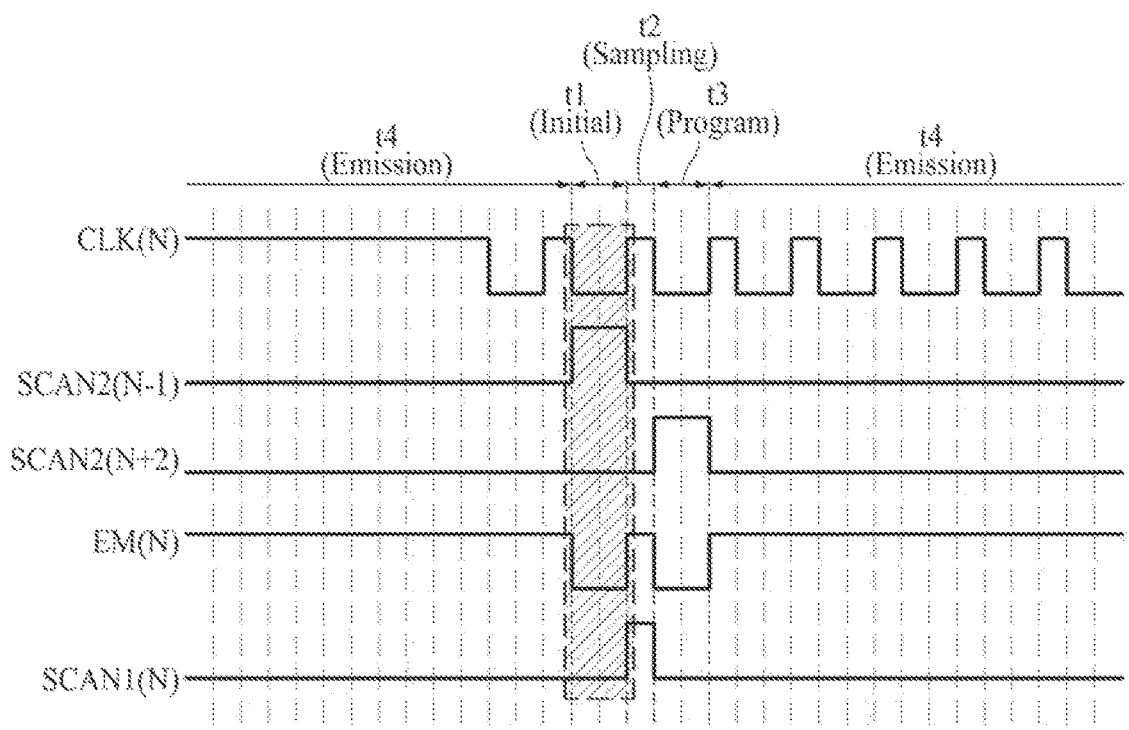

Referring to FIGS. 8A and 8B, during the first period t1, in response to the on-level of the second (N−1) scan signal SCAN2(N−1) supplied from the scan driver 220, the first charge transistor T1a charges the Q node to the on-level, and the second and fourth discharge transistors T5a and T5q can discharge the QB node to the low potential power supply voltage VSS. When the first and second output transistors T6 and T62 are turned-on by the on-level of the Q node, the off-level of the clock signal CLK(N) can be output to the off-level of the emission control signal EM(N) through the output line 26. Also, the off-level of the clock signal CLK(N) can be output to the off-level of the first scan signal SCAN1(N) through the scan output line 27.

Figure 9A:
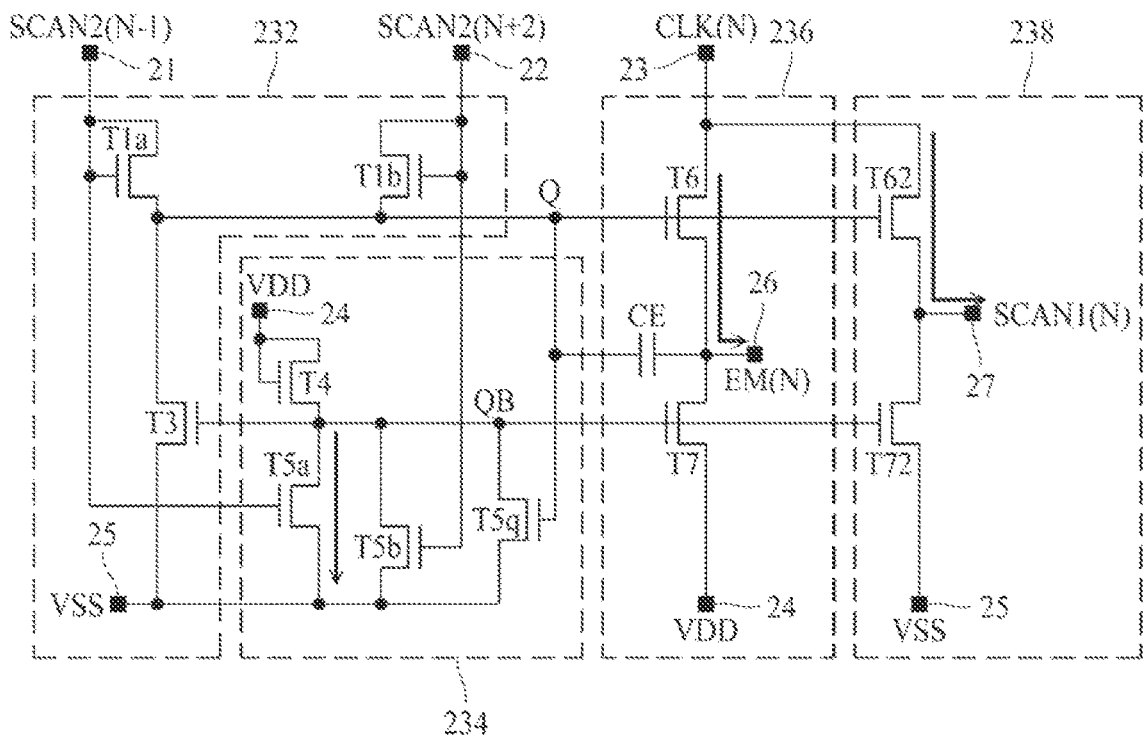
FIGS. 9A and 9B illustrate an operation and a driving waveform during a second period of the emission control stage according to one embodiment of the present disclosure.
Figure 9B:
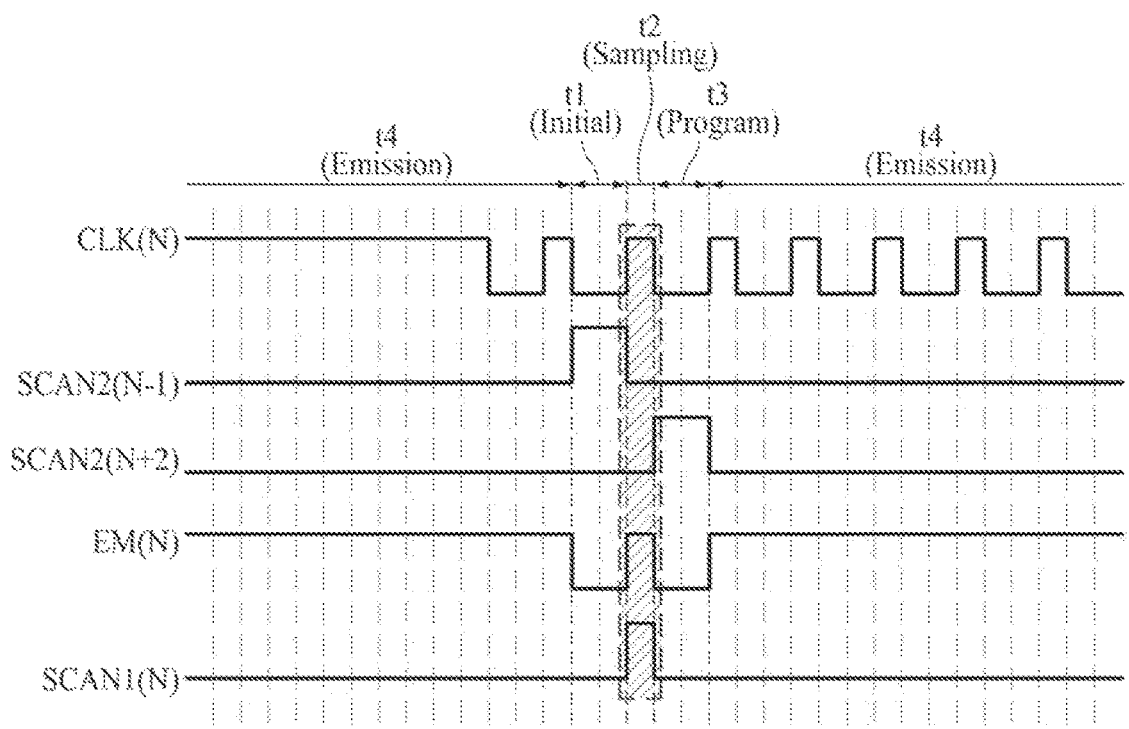

Referring to FIGS. 9A and 9B, during the second period t2, the Q node is floated to the on-level by the off-level of the second (N−1) scan signal SCAN2(N−1), and the second and fourth discharge transistor T5a and T5q can discharge the QB node to the low potential power supply voltage VSS. The first and second output transistors T6 and T62, which maintain the turn-on state by the on-level of the Q node, can output the on-level of the clock signal CLK(N) to enable the on-level of the first scan signal SCAN1(N) and the emission control signal EM(N). At this time, the on-level of the Q node can be increased by the bootstrapping operation of the capacitor CE connected between the Q node and the output line 26, thereby improving the current capability of the first and second output transistors T6 and T62. Accordingly, the rising time of the emission control signal EM(N) and the first scan signal SCAN1(N) can be improved.

Figure 10A:
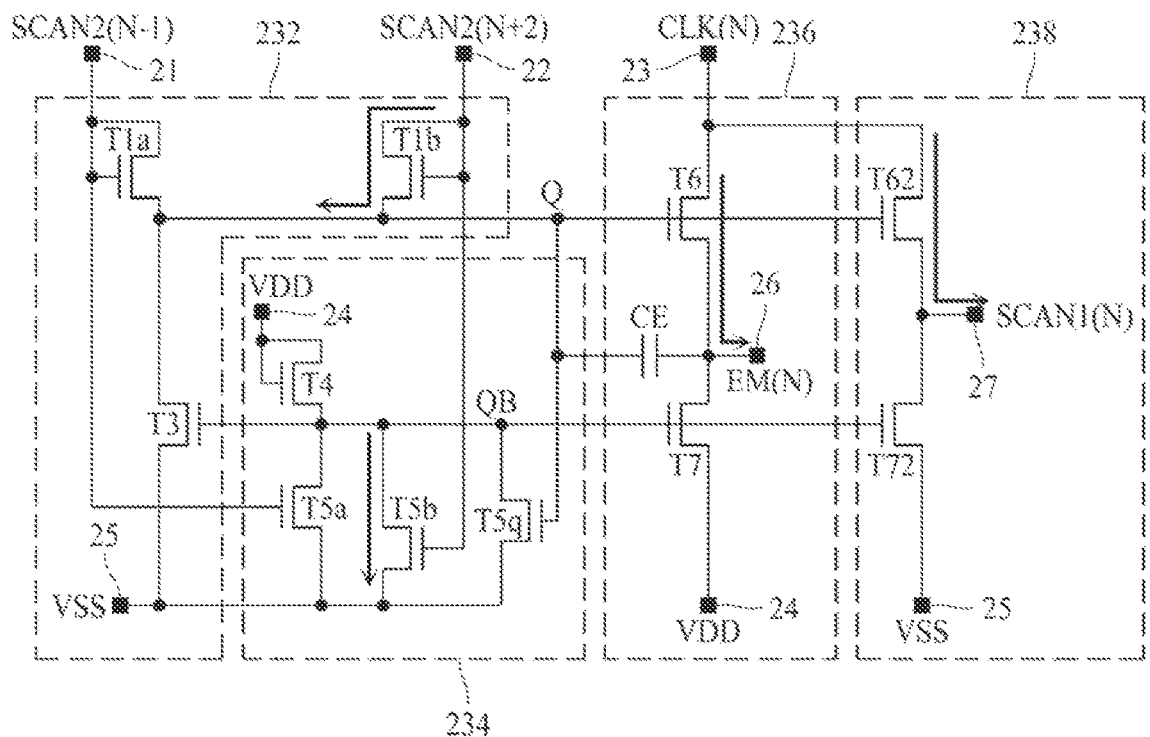
FIGS. 10A and 10B illustrate an operation and a driving waveform during a third period of the emission control stage according to one embodiment of the present disclosure.
Figure 10B:
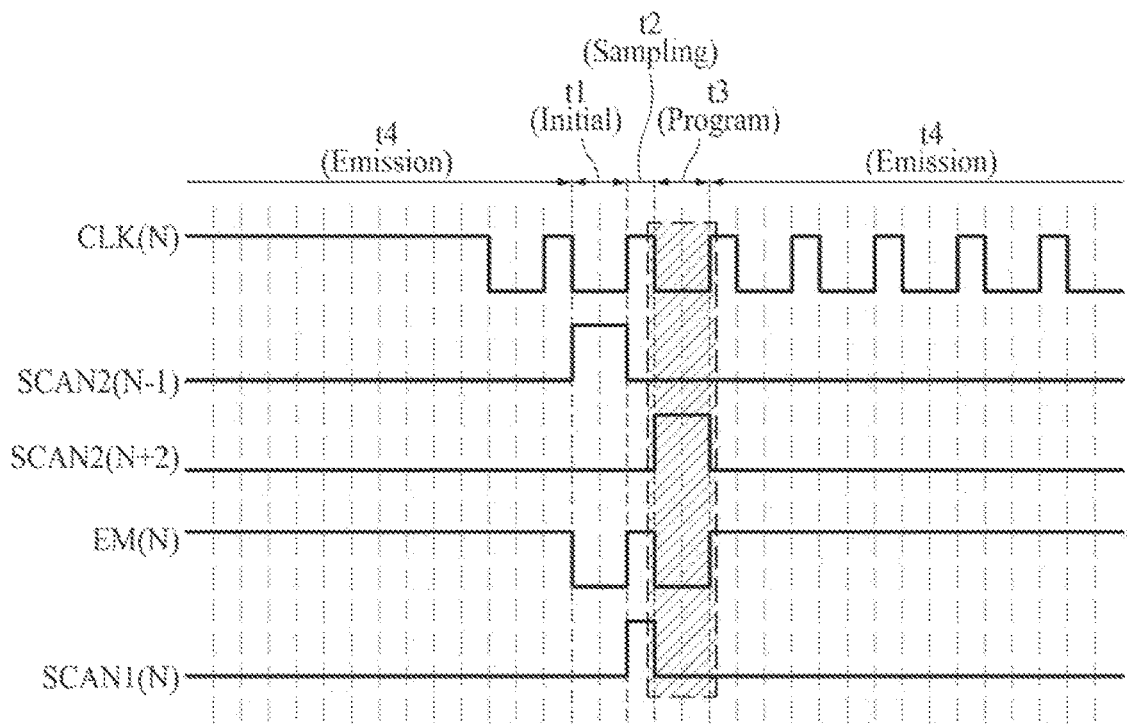

Referring to FIGS. 10A and 10B, during the third period t3, in response to the on-level of the second (N+2) scan signal SCAN2(N+2) supplied from the scan driver 220, the second charge transistor T1b charges the Q node to the on-level, and the third discharge transistor T5b can discharge the QB node to the low potential power supply voltage VSS. The first and second output transistors T6 and T62 can maintain the turn-on state by the on-level of the Q node, and can output the off-level of the clock signal CLK(N) to enable the off-level of the first scan signal SCAN1(N) and the emission control signal EM(N).

Figure 11A:
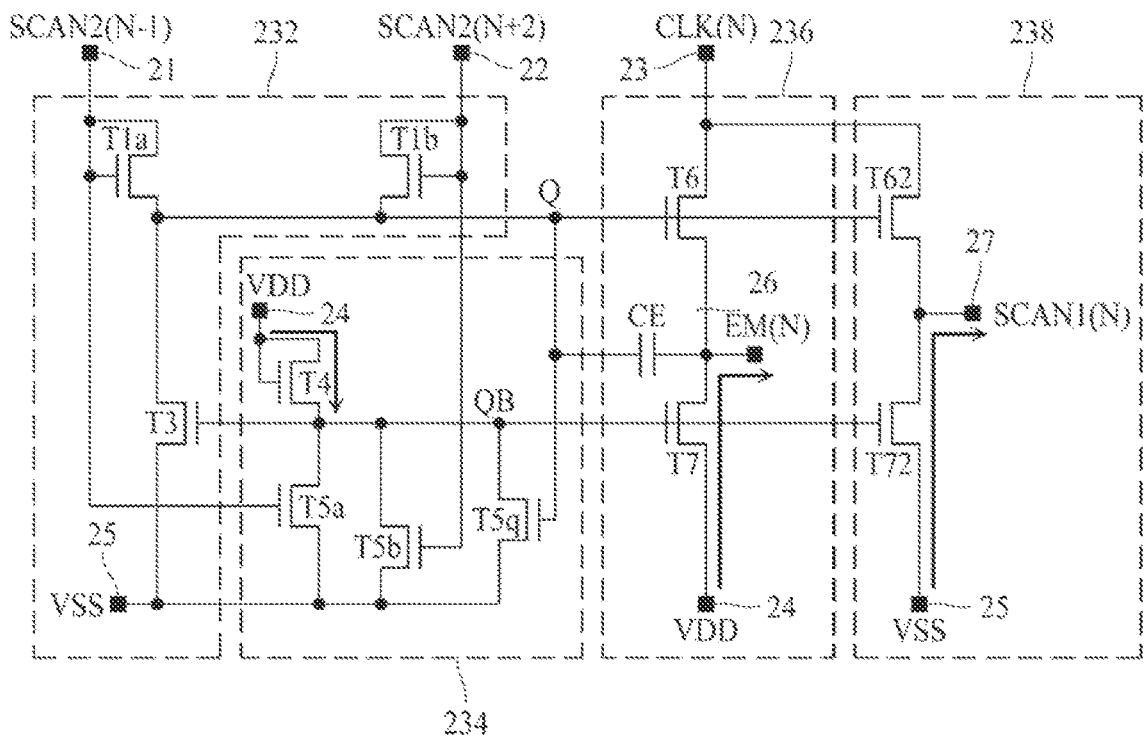
FIGS. 11A and 11B illustrate an operation and a driving waveform during a fourth period of the emission control stage according to one embodiment of the present disclosure.
Figure 11B:
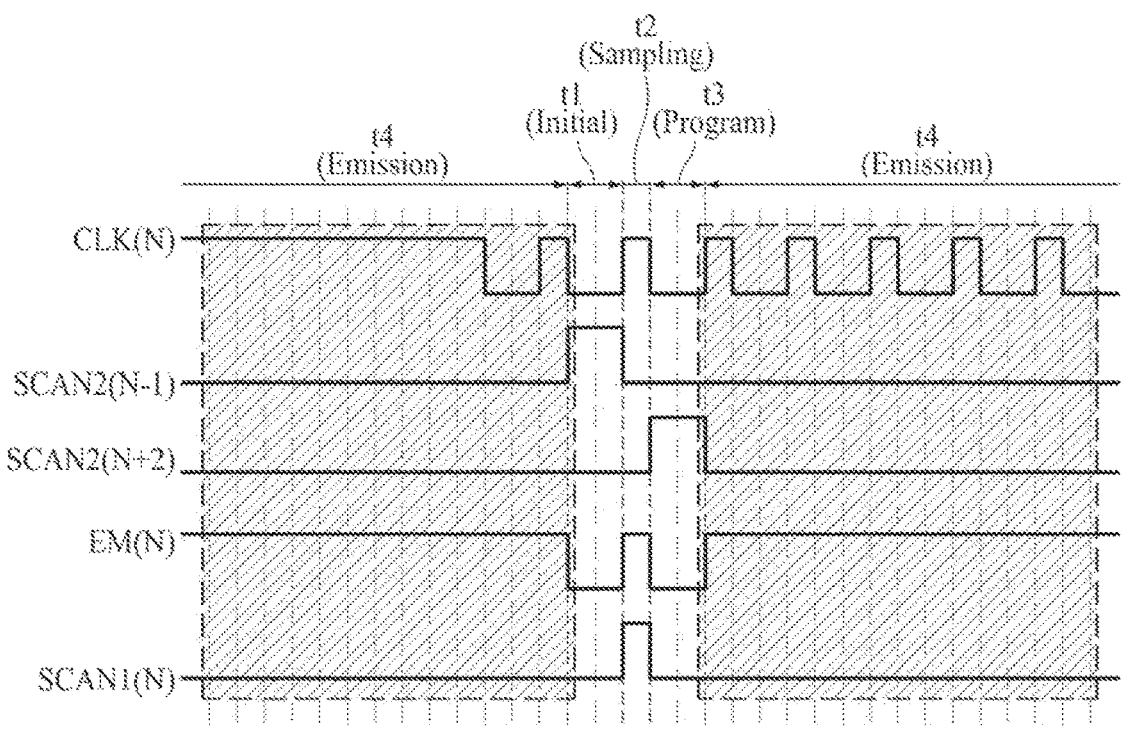

Referring to FIGS. 11A and 11B, during the fourth period t4, in response to the off-level of the second (N+2) scan signal SCAN2(N+2), the second charge transistor T1b and the third discharge transistor T5b are turned-off, and the QB node can be charged to the on-level by the high potential power supply voltage VDD supplied through the third charge transistor T4. The third output transistor T7 can output the high potential power supply voltage VDD to enable the on-level of the emission control signal EM(N) by the on-level of the QB node, and the fourth output transistor T72 can output the low potential power supply voltage VSS to enable the off-level of the first scan signal SCAN1(N). According as the first discharge transistor T3 is turned-on by the on-level of the QB node, the Q node can be discharged to the low potential power supply voltage VSS, and the first and second output transistors T6 and T62 can be turned-off.

As described above, in the emission control driver according to one embodiment of the present disclosure, each emission control stage outputs the emission control signal and the first scan signal by the use of second scan signal output from the scan driver so that it is possible to reduce the circuit configuration and size of the gate driver.

Accordingly, the emission control driver, the display panel, and the display device according to one embodiment of the present disclosure can reduce the bezel area.

In the emission control driver according to one embodiment of the present disclosure, the third output transistor controlled by the QB node stably supplies the gate-on voltage of the emission control signal by using the high potential power supply voltage during the emission period occupying most of the time in each frame, and the fourth output transistor can stably supply the gate-off voltage of the first scan signal by using the low potential power supply voltage.

In the emission control driver according to one embodiment of the present disclosure, the first and second output transistors controlled by the Q node supplies the gate-off voltage and the gate-on voltage of the first scan signal and the emission control signal by the use of scan signal and clock signal from the scan driver, to thereby improve the rising time of the first scan signal and the emission control signal.

Accordingly, the emission control driver, the display panel, and the display device according to one embodiment of the present disclosure can improve the rising time of the first scan signal and the emission control signal, thereby improving reliability.

The emission control driver, the display panel, and the display device comprising the same according to one or more embodiments of the present disclosure can be applied to various electronic devices. For example, the emission control driver, the display panel, and the display device comprising the same according to one embodiment of the present disclosure can be applied to a mobile device, a video phone, a smart watch, a watch phone, a wearable device, a foldable device, a rollable device, a bendable device, a flexible device, a curved device, an electronic diary, electronic book, a portable multimedia player (PMP), a personal digital assistant (PDA), MP3 player, a mobile medical device, a desktop PC, a laptop PC, a netbook computer, a workstation, a navigator, a vehicle navigator, a vehicle display device, a television, a wall paper display device, a signage device, a game device, a notebook computer, a monitor, a camera, a camcorder, and home appliances.

In addition to the above-mentioned advantageous effects of the present disclosure, other features and advantages of the present disclosure will be clearly understood by those skilled in the art from the above description or explanation. Furthermore, features, structures, effects and so on exemplified in at least one example of the present disclosure can be implemented by combining or modifying other examples by a person having ordinary skilled in this field. Therefore, contents related to such combinations and modifications should be interpreted as being included in the scope of the present application.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display device comprising:
a display panel configured to display an image through sub pixels;
a scan driver embedded in the display panel and configured to supply a second scan signal to each of second gate lines connected to the sub pixels; and
an emission control driver embedded in the display panel and configured to supply an emission control signal to each of third gate lines connected to the sub pixels, and supply a first scan signal to each of first gate lines connected to the sub pixels, the emission control driver comprising a plurality of emission control stages,
wherein each of the plurality of emission control stages includes:
an output buffer circuit configured to output the emission control signal to an output line and output the first scan signal to a scan output line by using a clock signal under control of a first control node, and configured to output a high potential power supply voltage to the output line and output a low potential power supply voltage to the scan output line under control of a second control node;
a charge/discharge circuit configured to charge the first control node by using the second scan signal supplied from the scan driver, and discharge the first control node by controlling the second control node; and
an inverter circuit configured to charge and discharge the second control node to be opposite to the first control node.

2. The display device according to claim 1,
wherein the output buffer circuit includes:
a first output transistor controlled by the first control node and configured to output the clock signal supplied to a clock line to the output line;
a second output transistor controlled by the first control node and configured to output the clock signal, which is supplied to the clock line, to the scan output line;
a third output transistor controlled by the second control node and configured to output the high potential power supply voltage, which is supplied to a first power line, to the output line; and
a fourth output transistor controlled by the second control node and configured to output the low potential power supply voltage, which is supplied to a second power line, to the scan output line.

3. The display device according to claim 2, wherein the output buffer circuit further includes a capacitor connected between the first control node and the output line.

4. The display device according to claim 2,
wherein the charge/discharge circuit includes:
a first charge transistor configured to charge the first control node with a (2-1)th scan signal by using the (2-1)th scan signal supplied from the scan driver;
a second charge transistor configured to charge the first control node with a (2-2)th scan signal by using the (2-2)th scan signal supplied from the scan driver; and
a first discharge transistor controlled by the second control node to discharge the first control node to the low potential power supply voltage.

5. The display device according to claim 4,
wherein the inverter circuit includes:
a third charge transistor configured to charge the second control node by using the high potential power supply voltage;
a second discharge transistor controlled by the (2-1)th scan signal to discharge the second control node to the low potential power supply voltage;

a third discharge transistor controlled by the (2-2)th scan signal to discharge the second control node to the low potential power supply voltage; and a fourth discharge transistor controlled by the first control node to discharge the second control node to the low potential power supply voltage.

6. The display device according to claim 4, wherein the emission control stage is an (N)th emission control stage configured to output an (N) emission control signal and a first (N) scan signal, where 'N' is an integer greater than 2, the (2-1) scan signal is a second (N−1) scan signal output from an (N−1) scan stage of the scan driver, and the (2-2) scan signal is a second (N+2) scan signal output from an (N+2) scan stage of the scan driver.

7. The display device according to claim 6, wherein, during first to fourth periods included in each frame, the (N) emission control signal has a gate-off level in the first and third periods, and a gate-on level in the second and fourth periods, and the first (N) scan signal has a gate-on level in the second period, and a gate-off level in the first, third and fourth periods.

8. The display device according to claim 7, wherein, during the first to fourth periods of the (N)th emission control signal and the first (N) scan signal, the first period corresponds to an initialization period of a pixel circuit to which the (N) emission control signal and the first (N) scan signal are supplied, the second period corresponds to a sampling period of the pixel circuit, the third period corresponds to a program period of the pixel circuit, and the fourth period corresponds to an emission period of the pixel circuit.

9. The display device according to claim 7, wherein, during the first period, the first charge transistor charges the first control node to the on-level of the second (N−1) scan signal, the first output transistor outputs the off-level of the clock signal to enable the gate-off level of the (N) emission control signal, and the second output transistor outputs the off-level of the clock signal to enable the gate-off level of the first (N) scan signal, or wherein, during the second period, the first control node is floated to the on-level by the off-level of the second (N−1) scan signal, the first output transistor outputs the on-level of the clock signal to enable the gate-on level of the (N) emission control signal, the second output transistor outputs the on-level of the clock signal to enable the gate-on level of the first (N) scan signal, and a voltage of the first control node is elevated according to the on-level of the clock signal, or wherein, during the third period, the second charge transistor charges the first control node to the on-level of the second (N+2) scan signal, the first output transistor outputs the off-level of the clock signal to enable the gate-off level of the (N) emission control signal, and the second output transistor outputs the off-level of the clock signal to enable the gate-off level of the first (N) scan signal, or wherein, during the fourth period, the second control node are charged to the on-level by the high potential power supply voltage, the third output transistor outputs the high potential power supply voltage to the gate-on level of the (N) emission control signal, and the fourth output transistor outputs the low potential power supply voltage to the gate-off level of the first (N) scan signal.

10. The display device according to claim 4, wherein the first charge transistor has a gate electrode and a drain electrode connected to a first input line supplying the (2-1)th scan signal in a diode structure and a source electrode connected to the first control node, wherein the second charge transistor has a gate electrode and a drain electrode connected to a second input line supplying the (2-2)th scan signal in a diode structure and a source electrode connected to the first control node, and wherein the first discharge transistor has a gate electrode connected to the second control node, a drain electrode connected to the first control node, and a source electrode connected a power line supplying the low potential power supply voltage.

11. The display device according to claim 5, wherein the third charge transistor is connected in a diode structure between the first power line and the second control node.

12. The display device according to claim 1, wherein each of the plurality of emission control stages is implemented with coplanar oxide thin film transistors including a light shielding layer.

13. A display panel comprising:

a display area configured to display an image through sub pixels;

a bezel area surrounding or adjacent to the display area;

a scan driver disposed in the bezel area and configured to supply a second scan signal to each of second gate lines connected to the sub pixels; and an emission control driver disposed in the bezel area, configured to supply an emission control signal to each of third gate lines connected to the sub pixels, and configured to supply a first scan signal to each of first gate lines connected to the sub pixels, the emission control driver comprising a plurality of emission control stages, wherein each of the plurality of emission control stages includes:

an output buffer circuit configured to output the emission control signal to an output line and output the first scan signal to a scan output line by using a clock signal under control of a first control node, and output a high potential power supply voltage to the output line and output a low potential power supply voltage to the scan output line under control of a second control node;

a charge/discharge circuit configured to charge the first control node by using the second scan signal supplied from the scan driver, and discharge the first control node by controlling the second control node; and an inverter circuit configured to charge and discharge the second control node to be opposite to the first control node.

14. The display panel according to claim 13, wherein the output buffer circuit includes:

a first output transistor controlled by the first control node and configured to output the clock signal supplied to a clock line to the output line;

a second output transistor controlled by the first control node and configured to output the clock signal, which is supplied to the clock line, to the scan output line;

a third output transistor controlled by the second control node and configured to output the high potential power supply voltage, which is supplied to a first power line, to the output line;

a fourth output transistor controlled by the second control node and configured to output the low potential power supply voltage, which is supplied to a second power line, to the scan output line; and a capacitor connected between the first control node and the output line.

15. The display panel according to claim 14, wherein the charge/discharge circuit includes:

a first charge transistor configured to charge the first control node with a (2-1)th scan signal by using the (2-1)th scan signal supplied from the scan driver;

a second charge transistor configured to charge the first control node with a (2-2)th scan signal by using the (2-2)th scan signal supplied from the scan driver; and a first discharge transistor controlled by the second control node to discharge the first control node to the low potential power supply voltage.

16. The display panel according to claim 15, wherein the inverter circuit includes:

a third charge transistor configured to charge the second control node by using high potential power supply voltage;

a second discharge transistor controlled by the (2-1)th scan signal to discharge the second control node to the low potential power supply voltage;

a third discharge transistor controlled by the (2-2)th scan signal to discharge the second control node to the low potential power supply voltage; and a fourth discharge transistor controlled by the first control node to discharge the second control node to the low potential power supply voltage.

17. The display panel according to claim 15, wherein the emission control stage is an (N)th emission control stage configured to output an (N) emission control signal and a first (N) scan signal, where 'N' is an integer greater than 2, the (2-1) scan signal is a second (N−1) scan signal output from an (N−1) scan stage of the scan driver, and the (2-2) scan signal is a second (N+2) scan signal output from an (N+2) scan stage of the scan driver.

18. The display panel according to claim 17, wherein, during the first to fourth periods included in each frame, the (N) emission control signal has a gate-off level in the first and third periods, and a gate-on level in the second and fourth periods, and the first (N) scan signal has a gate-on level in the second period, and a gate-off level in the first, third and fourth periods, wherein, during the first to fourth periods of the (N)th emission control signal and the first (N) scan signal, the first period corresponds to an initialization period of a pixel circuit to which the (N) emission control signal and the first (N) scan signal are supplied, the second period corresponds to a sampling period of the pixel circuit, the third period corresponds to a program period of the pixel circuit, and the fourth period corresponds to an emission period of the pixel circuit.

19. The display panel according to claim 15, wherein the first charge transistor has a gate electrode and a drain electrode connected to a first input line supplying the (2-1)th scan signal in a diode structure and a source electrode connected to the first control node, wherein the second charge transistor has a gate electrode and a drain electrode connected to a second input line supplying the (2-2)th scan signal in a diode structure and a source electrode connected to the first control node, and wherein the first discharge transistor has a gate electrode connected to the second control node, a drain electrode connected to the first control node, and a source electrode connected a power line supplying the low potential power supply voltage.

20. The display panel according to claim 13, wherein each of the plurality of emission control stages is implemented with coplanar oxide TFTs including a light shielding layer.

* * * * *